United States Patent [19]
Murray

[11] 3,942,243
[45] Mar. 9, 1976

[54] OHMIC CONTACT FOR SEMICONDUCTOR DEVICES

[75] Inventor: Roger W. Murray, Sunnyvale, Calif.
[73] Assignee: Litronix, Inc., Cupertino, Calif.
[22] Filed: Jan. 25, 1974
[21] Appl. No.: 436,397

[52] U.S. Cl. .................. 29/590; 29/591; 357/67; 357/71
[51] Int. Cl.$^2$.......................... B01J 17/00
[58] Field of Search ............ 29/589, 590, 591, 580; 357/67, 71, 3; 75/141; 148/1.5

[56] References Cited
UNITED STATES PATENTS

| | | | |
|---|---|---|---|
| 3,562,604 | 2/1971 | Block | 357/71 |
| 3,636,617 | 1/1972 | Schmidt | 29/589 |
| 3,684,930 | 8/1972 | Collins | 357/67 |
| 3,728,090 | 4/1973 | Hoffman | 357/67 |

OTHER PUBLICATIONS
RCA Technical Notes No. 737, Jan. 1968, "Method of Contacting a Semiconductor Surface", by Assour.

Electrochemical Technology, Jan. 1970, pp. 145 and 146, "Diffusion of Zinc Through Films of Refractory Metals on GaAs," Marinace.

Primary Examiner—W. Tupman
Attorney, Agent, or Firm—Townsend and Townsend

[57] ABSTRACT

An ohmic contact for semiconductor devices, typically for contact to the P-type region of a GAsP Light Emitting Diode. The ohmic contact comprises a sequential deposition of a multi-layered structure comprising, respectively, aluminum, zinc and aluminum. The multi-layered structure is then heated at time and temperature conditions sufficient to fuse or alloy the metals and form a small region of P+ conductivity in the P-type semiconductor material.

8 Claims, 4 Drawing Figures

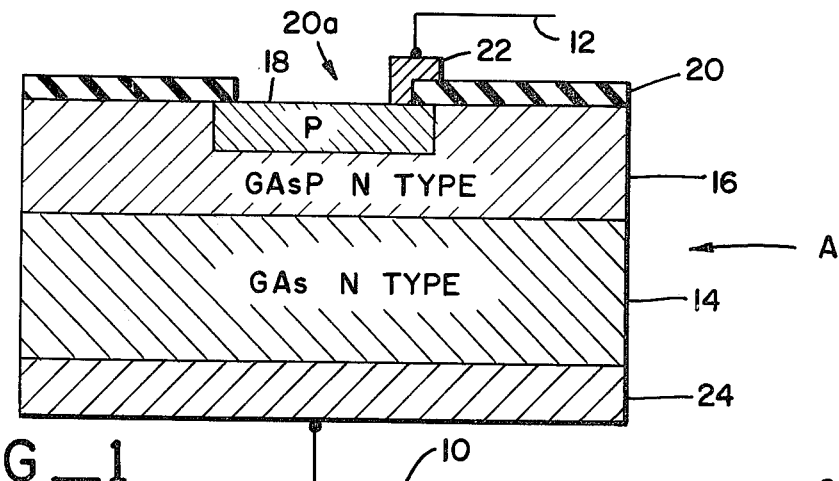
FIG_1
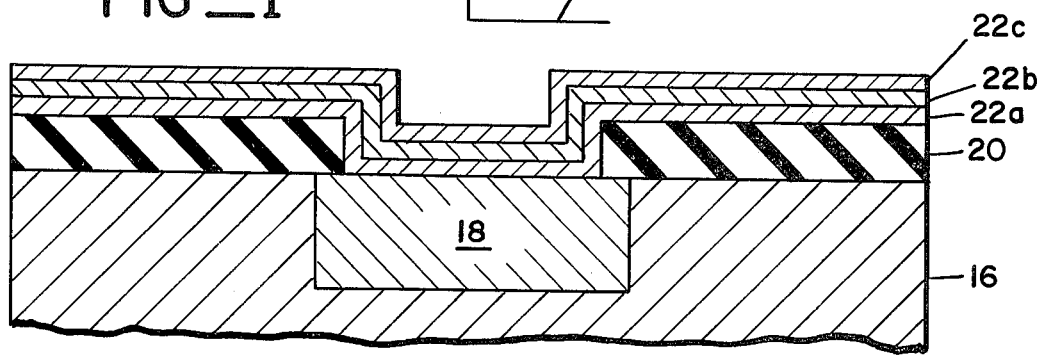
FIG_2a
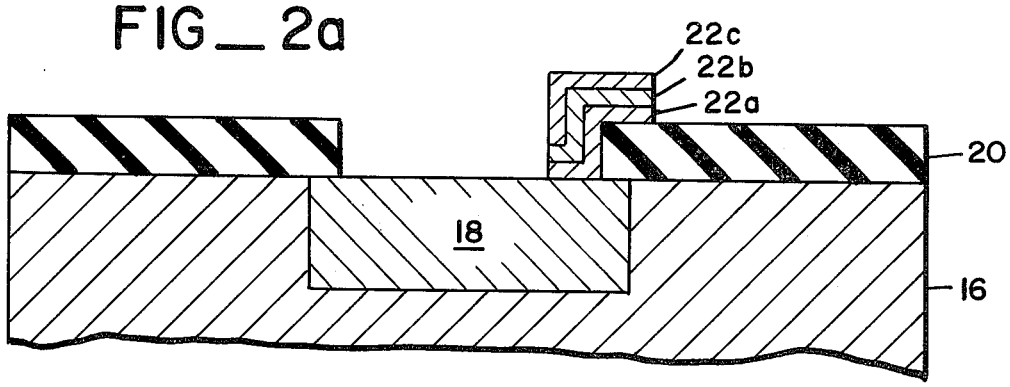
FIG_2b
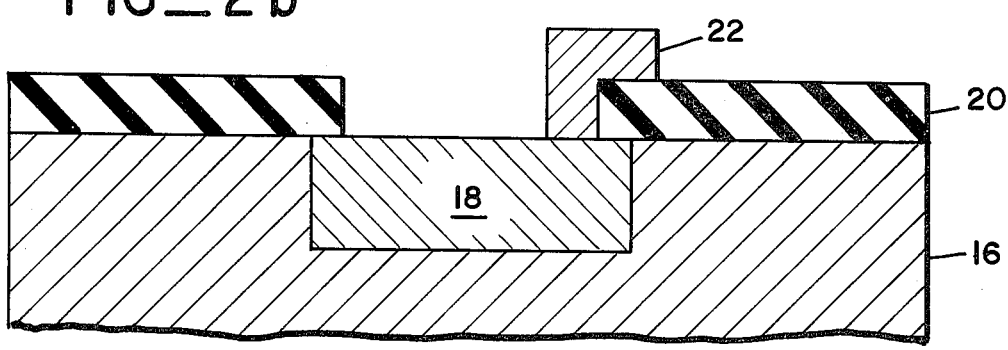
FIG_2c

OHMIC CONTACT FOR SEMICONDUCTOR DEVICES

This invention relates to ohmic contacts for semiconductor devices, and, more particularly, to ohmic contacts for the P-type region of Gallium Arsenide Phosphide (GAsP) Light Emitting Diodes (LED's).

In the fabrication of light emitting diodes, it is necessary to form ohmic contacts to both the N and P-type regions of the semiconductor material. In a typical N-type GAsP LED, the ohmic contact to the P-type semiconductor material is particularly critical. Specifically, since the light produced by the LED is emitted at the P-type region, it is necessary that the ohmic contact thereto be quite small relative to the surface area of the P-type region, in order to maximize the light output of the LED. However, it is further necessary that the ohmic contact exhibit low resistivity and high mechanical strength so as to maximize the brightness, efficiency, current capability and mechanical reliability of the LED. These requirements have rendered the formation of the ohmic contact to the P-type region of an N-type GAsP LED particularly troublesome.

Various ohmic contacts for the P-type region of an N-type GAsP LED have been disclosed in the prior art. U.S. Pat. Nos. 3,636,617 and 3,636,618 disclose the use of pure aluminum deposited on the P-type semiconductor material. An alternative prior art ohmic contact to the P region of an N-type GAsP LED is formed from an alloy of gold and zinc.

According to the present invention, an ohmic contact for the P-type region of an N-type GAsP LED is provided in the form of a sequentially deposited multi-layer structure of aluminum, zinc and aluminum, which is fused or alloyed to form the ohmic contact. Typically, the structure of the top side of the light emitting diode prior to the formation of ohmic contact comprises a mask of dielectric material such as silicon nitride, having an aperature exposing the surface of a region of P-type GAsP semiconductor material. According to the present invention, sequential layers of aluminum, zinc and aluminum, respectively, are evaporated onto the top side of the LED at this stage of manufacture. The extent of metal layers are confined to expose the majority of the P-type region, leaving the multi-layered aluminum-zinc-aluminum structure on a relatively small area of the P-type region, typically by a conventional photomask-etch technique. The LED is subjected to an elevated temperature for a sufficient time to fuse or alloy the aluminum-zinc-aluminum layers. In this manner, the zinc will diffuse throughout the aluminum and into the P-type semiconductor material, forming a small region of P+ conductivity adjacent the contact structure resulting in an ohmic contact of particularly low resistivity. Thereafter, a lead wire may be bonded to the ohmic contact thus formed in a conventional manner.

Accordingly, it is an object of the present invention to provide an ohmic contact for P-type semiconductor material formed of an aluminum-zinc alloy.

Another object of the present invention is to provide an ohmic contact for P-type semiconductor material formed by successive deposition of aluminum-zinc-aluminum layers.

Yet another object of the present invention is to provide an ohmic contact for the P-type region of an N-type GAsP LED which possesses low resistivity.

The ohmic contact according to present invention is advantageous in that the resistivity thereof is particularly low in comparison to the resistivity achieved in accordance with the prior art. Moreover, since the ohmic contact is quite small, the obstruction of the emitted light is minimized, thereby maximizing the light output of the LED. Nonetheless, the mechanical reliability and yield achieved with the ohmic contact of the present invention is quite high.

These and other objects, features and advantages of the present invention will be more readily apparent from the following detailed description, wherein reference is made to the accompanying drawings, in which:

FIG. 1 is a cross-sectional view of a GAsP LED fabricated according to the present invention;

FIGS. 2 are cross-sectional views, similar to FIG. 1, of the upper portion of the GAsP LED depicted in FIG. 1, at various stages of manufacture;

In FIG. 2a there is depicted the top portion of the GAsP LED with the multi-layered structure of the present invention deposited thereon;

in FIG. 2b there is depicted the top portion of the GAsP LED with the multi-layered structure confined to the desired region; and in FIG. 2c there is depicted the top portion of the GAsP LED after the fusing or alloying of the multi-layered structure to form the ohmic contact.

The present invention, in its preferred embodiment, relates to the fabrication of ohmic contacts to the P-type regions of N-type GAsP LED's. Referring initially to FIG. 1, there is depicted, generally at A, a typical N-type GAsP LED which generally comprises a P-N junction formed in GAsP semi-conductor material, the N and P-type semi-conductor materials being respectively connected to a pair of leads 10 and 12. The typical fabrication procedure for this device commences with the provision of a N-type GAs substrate 14. The substrate 14 is placed in a epitaxial reactor, and an epitaxial layer of N-type GAsP semiconductor material 16 is grown thereon. Typically, a conventional grading technique is employed so that the layer 16 will be graded from substantially pure GAs material adjacent to substrate 14 to the desired GAsP material at the other surface of layer 16. Generally, in the desired GAsP structure, the ratio of Arsenic to Phosphorous will be approximately 3 to 2.

A dielectric mask 20, typically comprising silicon nitride, is formed on the top or upper surface of the epitaxial GAsP layer 16. Dielectric layer 20 includes an aperature 20a through which dopant material is diffused to form a P-type conductivity region 18 in the epitaxial GAsP layer 16.

Ohmic contacts 22 and 24 are formed to the P-type material 18 and the N-type material 14, respectively. Leads 10 and 12 are then attached to ohmic contacts 24 and 22 respectively, to form the completed structure depicted in FIG. 1.

The foregoing GAsP LED structure and method of fabrication is conventional and is described herein for illustrative purposes only, being it expressly understood that the ohmic contact according to the present invention may be employed with other semi-conductor structures and processes.

Referring now to FIGS. 2a through 2c, the fabrication of the ohmic contact according to the present invention will be now described in detail. Referring initially to 2a, an aluminum layer 22a is evaporated or otherwise deposited, onto the upper surface of P-type region 18 and the dielectric layer 20. A zinc layer 22b is evaporated or otherwise deposited, onto aluminum layer 22a. A second aluminum layer 22c is evaporated or otherwise deposited onto zinc layer 22b, to form the structure illustrated in FIG. 2a.

Since the light emitted from the LED exits through the aperture 20a in the dielectric layer 20, it is essential that the opaque metal ohmic contact 22 to be formed extend over a relatively small portion of the surface area of P-type region 18. To this end, the application of metal layers 22a, 22b and 22c may be accomplished through a mask (not shown) so that the layers 22a, 22b and 22c will be confined to a small region of the top surface of the LED, as depicted in FIG. 2b, rather than covering the entire surface of the LED, as depicted in FIG. 2a. However, in accordance with the preferred embodiment of the present invention, the initial deposition of layers 22a, 22b and 22c covers the entire surface of the LED as depicted in FIG. 2a. Thereafter, a conventional photomasketch technique is employed to etch away the undesired portions of layers 22a, 22b and 22c, leaving the structure depicted in FIG. 2b, wherein the layers 22a, 22b and 22c extend on to a relatively small portion of the surface area of P-type region 18 adjacent dielectric layer 20 and extend outwardly on to the surface of dielectric layer 20, forming a multi-layered structure having a generally L-shaped cross-section as depicted in FIG. 2b.

The LED is heated at sufficient time and temperature conditions to fuse or alloy the aluminum-zinc-aluminum layers 22a, 22b and 22c. An appropriate temperature has been found to be in the range in 450°C to 550°C while an appropriate time condition has been found to be from approximately 20 minutes to 1 hour. At such elevated temperatures, and with sufficient time, the zinc 22b will become mobile in the aluminum 22a and 22c to form a unitary alloyed or fused structure 22, as depicted in FIG. 2c. Moreover, the zinc will diffuse through the aluminum into the P-type semi-conductor material 18. Since zinc is a P-type dopant for GAsP semi-conductor material, a small region of P+ conductivity will be formed adjacent ohmic contact 22, thereby providing a low resistivity ohmic contact. Subsequently, a wire lead 12 may be attached to ohmic contact 22 in a conventional manner.

It is apparent that the order of the processing steps thus described is not critical and may be varied without departing from the present invention. For example, the photo mask-etch procedure, if employed to remove the metals from undesired regions on the upper surface of the LED, may be performed either before or after the fusing or alloying procedure.

EXAMPLE 1

An N-type GAsP LED is provided at the stage of manufacture wherein there has been formed a P-type region 18 having an exposed upper surface with a dielectric layer 20 adjacent thereto. The device is heated in a vacuum to approximately 375°C and a layer of aluminum 22a is evaporated thereon to a thickness of approximately 1500 Angstroms. A layer of zinc 22b having a thickness of approximately 500 Angstroms is evaporated onto aluminum layer 22a. A second layer of aluminum 22c is evaporated onto zinc layer 22b to a total thickness for the layers 22a, 22b and 22c of approximately 1 micron.

By a conventional photo mask-etch technique, the bulk of the metal layers 22a, 22b and 22c are removed from the surface of the P-type region 18 to form a multi-layered structure having a generally L-shaped cross-section, covering a relatively small portion of the surface area of the P-type region 18 and extending onto the dielectric layer 20, as depicted in FIG. 2b.

The LED is heated to approximately 525°C for approximately 30 minutes to alloy the metals 22a, 22b and 22c into the unitary structure 22 depicted in FIG. 2c, while diffusing zinc into the P-type region 18 adjacent the contact 22 to form a P+ region providing a low resistivity ohmic contact 22 as desired. Subsequently a wire lead 12 may be bonded to the ohmic contact 22.

While particular embodiments of the present invention have been described in detail, it is apparent that adaptations and modifications may occur to those skilled in the art, which adaptations and modifications may be made without departing from the spirit and scope of the present invention as set forth in the claims.

What is claimed is:

1. A method for forming an ohmic contact to the p-type region of an n-type GAsP LED having a dielectric layer on the upper surface thereof including an aperture exposing the surface of said p-type region comprising the steps of: applying at least two layers on at least a portion of said p-type region, each layer consisting of a member of the group consisting of aluminum and zinc, at least one of said layers being aluminum, at least another of said layers being zinc, and heating said LED at sufficient time and temperature conditions to render said zinc mobile in said aluminum.

2. A method for forming an ohmic contact to the p-type region of an n-type GAsP LED having a dielectric layer on the upper surface thereof including an aperture exposing the surface of said p-type region comprising the steps of: applying a first layer of aluminum on at least a portion of said p-type region, applying a layer of zinc on said first layer of aluminum, applying a second layer of aluminum on said layer of zinc and heating said LED at sufficient time and temperature conditions to render said zinc mobile in said aluminum.

3. The method according to claim 2 comprising the step of etching said aluminum and zinc off the major portion of said p-type region to render the surface area of said p-type region covered by said aluminum and zinc small relative to the surface area of said p-type region.

4. The method according to claim 3 wherein said step of etching is accomplished prior to said step of heating.

5. The method according to claim 2 wherein said first aluminum layer is applied extending onto said dielectric layer.

6. The method according to claim 2 wherein said first aluminum layer is applied to a thickness of approximately 1500 angstroms.

7. The method according to claim 6 wherein said zinc layer is deposited to a thickness of approximately 500 angstroms.

8. The method according to claim 7 wherein said aluminum and zinc layers are deposited to a total thickness of approximately 1 micron.

* * * * *